United States Patent
Shields et al.

(10) Patent No.: US 9,156,558 B2
(45) Date of Patent: *Oct. 13, 2015

(54) INFLATABLE PERSONAL RESTRAINT SYSTEMS

(75) Inventors: Ronald A. Shields, Mesa, AZ (US);
Peter A. Settles, Maricopa, AZ (US);
Willard F. Hagan, Phoenix, AZ (US);
Giuseppe Gullotto, Phoenix, AZ (US)

(73) Assignee: AmSafe, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/174,659

(22) Filed: Jun. 30, 2011

(65) Prior Publication Data

US 2012/0259484 A1 Oct. 11, 2012

Related U.S. Application Data

(60) Provisional application No. 61/516,681, filed on Apr. 5, 2011.

(51) Int. Cl.
*G05B 23/02* (2006.01)
*B64D 25/02* (2006.01)
(Continued)

(52) U.S. Cl.
CPC .............. *B64D 25/02* (2013.01); *B64D 11/062* (2014.12); *B64D 11/06205* (2014.12); *B64D 25/00* (2013.01); *B64D 2201/00* (2013.01)

(58) Field of Classification Search
CPC ........ B64D 25/00; B64D 25/02; B64D 25/04; B64D 25/06; B64D 25/08; B64D 25/10; B64D 25/12; B64D 25/14; B64D 25/16; B64D 25/18; B64D 25/20; B64D 2011/061; B64D 2011/00; B64D 2011/0668; B60R 2021/01122; B60R 2021/01129; B60R 2021/01136; B60R 2021/01143; B60R 2021/0115; B60R 2021/01156; B60R 2021/01163; B60R 2021/0117
USPC .............. 701/29.7, 29.8, 34.4, 45, 29.1, 29.9, 701/31.7, 32.7, 32.8
See application file for complete search history.

(56) References Cited

U.S. PATENT DOCUMENTS 3,766,612 A 10/1973 Hattori
3,777,255 A 12/1973 Young et al.
(Continued)

FOREIGN PATENT DOCUMENTS

CN 2380446 5/2000
CN 1446155 1/2003
(Continued)

OTHER PUBLICATIONS

European Search Report dated Oct. 16, 2012, Applicant: AmSafe, Inc., European Application No. 12161935.7, 4 pages.
(Continued)

*Primary Examiner* — Jerrah Edwards
(74) *Attorney, Agent, or Firm* — Perkins Coie LLP

(57) ABSTRACT

An electronic module assembly (EMA) for use in controlling one or more personal restraint systems. A programmed processor within the EMA is configured to determine when a personal restraint system associated with each seat in a vehicle should be deployed. In addition, the programmed processor is configured to perform a diagnostic self-test to determine if the EMA and the personal restraint systems are operational. In one embodiment, results of the diagnostic self-test routine are displayed on a display included on the electronic module assembly. In an alternative embodiment, the results of the diagnostic self-test routine are transmitted via a wireless transceiver to a remote device. The remote device can include a wireless interrogator or can be a remote computer system such as a cabin management computer system.

17 Claims, 9 Drawing Sheets

(51) Int. Cl.
*B64D 25/00* (2006.01)
*B64D 11/06* (2006.01)

(56) References Cited

U.S. PATENT DOCUMENTS

| | | | |
|---|---|---|---|
| 5,581,060 | A | 12/1996 | Kobayashi et al. |
| 5,879,024 | A | 3/1999 | Estep |
| 5,984,350 | A * | 11/1999 | Hagan et al. .................. 280/735 |
| 6,002,325 | A | 12/1999 | Conaway |
| 6,239,695 | B1 | 5/2001 | Okada et al. |
| 6,449,545 | B1 | 9/2002 | Nitschke et al. |
| 6,682,094 | B1 | 1/2004 | Laituri et al. |
| 6,837,516 | B2 | 1/2005 | Miyata et al. |
| 7,224,270 | B2 | 5/2007 | Patterson et al. |
| 7,296,825 | B1 | 11/2007 | Zia et al. |
| 8,818,759 | B2 * | 8/2014 | Shields et al. ................ 702/183 |
| 2002/0050826 | A1 | 5/2002 | Boran et al. |
| 2003/0030522 | A1 | 2/2003 | Kasashima et al. |
| 2003/0155753 | A1 | 8/2003 | Breed |
| 2004/0130442 | A1* | 7/2004 | Breed et al. .................. 340/443 |
| 2006/0157968 | A1* | 7/2006 | Kitazawa ...................... 280/806 |
| 2006/0163430 | A1* | 7/2006 | Cordina et al. ............. 244/118.5 |
| 2007/0005202 | A1* | 1/2007 | Breed ............................. 701/29 |
| 2007/0055429 | A1* | 3/2007 | Komaki et al. ................. 701/45 |
| 2007/0096447 | A1 | 5/2007 | Tabe |
| 2007/0156311 | A1 | 7/2007 | Elcock et al. |
| 2007/0232164 | A1 | 10/2007 | Swan et al. |
| 2010/0177538 | A1* | 7/2010 | Scherr ............................ 363/39 |
| 2011/0004832 | A1 | 1/2011 | Canal et al. |
| 2012/0256403 | A1 | 10/2012 | Shields |
| 2012/0259503 | A1* | 10/2012 | Settles ........................ 701/31.5 |
| 2012/0259586 | A1 | 10/2012 | Shields et al. |
| 2012/0326422 | A1 | 12/2012 | Baca |

FOREIGN PATENT DOCUMENTS

| | | |
|---|---|---|
| CN | 1541871 | 11/2004 |
| GB | 2273568 A | 6/1994 |
| JP | 2008100576 | 12/2011 |
| TW | I303231 B | 11/2008 |
| TW | I337146 B | 2/2011 |
| WO | WO-01/29632 | 4/2001 |
| WO | WO-2007/078968 | 7/2007 |

OTHER PUBLICATIONS

European Search Report and Search Opinion dated Dec. 6, 2012; European Application No. 12160025.8; (6 pages).
Partial European Search Report; Application No. EP12159833.8, mailed Dec. 6, 2012, 6 pages.
Non-Final Office Action dated May 7, 2014; U.S. Appl. No. 13/228,362; 11 pages.
Non-Final Office Action dated Sep. 16, 2013; U.S. Appl. No. 13/228,362; 11 pages.
Non-Final Office Action dated Dec. 6, 2013; U.S. Appl. No. 13/228,333; 9 pages.

* cited by examiner

INFLATABLE PERSONAL RESTRAINT SYSTEMS

CROSS-REFERENCE TO RELATED APPLICATION(S)

The present application claims the benefit of U.S. Provisional Application No. 61/516,681, filed Apr. 5, 2011, titled "AIRCRAFT AIRBAGS WITH WIRELESS DIAGNOSTICS", which is hereby incorporated by reference in its entirety.

TECHNICAL FIELD

The technology disclosed herein relates generally to safety restraint systems and to aircraft safety restraint systems in particular.

BACKGROUND

Various types of seat belt and airbag systems have been used to protect passengers in automobiles, aircraft and other vehicles. In automobiles, airbags typically deploy from the steering column, dashboard, side panel, and/or other fixed locations. During a rapid deceleration event (e.g., a collision), a sensor detects the event and transmits a corresponding signal to an initiation device (e.g., a pyrotechnic device) on an airbag inflator. Initiation causes the inflator to release compressed gas into the airbag via a hose, thereby rapidly inflating the airbag. There are a number of different types of inflators known in the art. Some inflators contain compressed gas (e.g., air, nitrogen, helium, argon, etc.). Other inflators (e.g., gas generating devices) provide high pressure gas via the chemical reaction of an energetic propellant.

Airbags can be deployed in a number of positions around the vehicle passenger or driver. Airbags positioned in the steering column, for example, can inflate in front of the driver to cushion his/her head and torso from forward impact. Airbags can also be positioned to reduce the likelihood of whiplash.

Although airbags that deploy from stationary locations (e.g., a steering column) may be effective in automobiles, they may not be as effective in other types of vehicles having other seating arrangements. Seats in commercial passenger aircraft, for example, can be configured in a variety of layouts that provide different spacing between succeeding rows and adjacent seats. Moreover, such layouts may lack the availability of stationary structures upon which to mount airbags. Additionally, seatbacks in aircraft may rotate forward and downward during a crash or similar event, and thus may be unsuitable for airbag storage. As a result, airbags have been developed that deploy from seat belts to accommodate occupants in aircraft and other vehicles. Such airbags can deploy from, for example, a lap belt and/or a shoulder belt to provide additional protection during a crash or other rapid deceleration event. Such airbag systems are described in detail in U.S. Pat. No. 5,984,350, which is owned by the assignee of the present application and is incorporated herein in its entirety by reference.

DETAILED DESCRIPTION

As will explained in further detail below, the disclosed technology relates to personal restraint systems for use in vehicles and in particular for use in aircraft. In one embodiment, the personal restraint systems are deployed by an electronics module assembly (EMA). The EMA includes a programmed processor and one or more crash sensors that are used to deploy one or more of the personal restraint systems. The EMA includes a diagnostic capability to determine the readiness of the personal restraint systems to deploy. In one embodiment, the EMA performs a diagnostic self-test upon manual activation of a button or other control on the EMA. The results of the diagnostic self-test can be indicated on a display on the EMA.

In another embodiment, the EMA includes a wireless transceiver. A request to perform a diagnostic self-test is received from a remote device via a message received on a wireless communication channel. The results of the self-test may be sent back to the remote device with the wireless transceiver. In one embodiment, the remote device is a handheld, wireless interrogator. In another embodiment, the remote device is a cabin management computer system of an aircraft of other computer system used to monitor/control the operation of an aircraft or vehicle.

Figure 1:
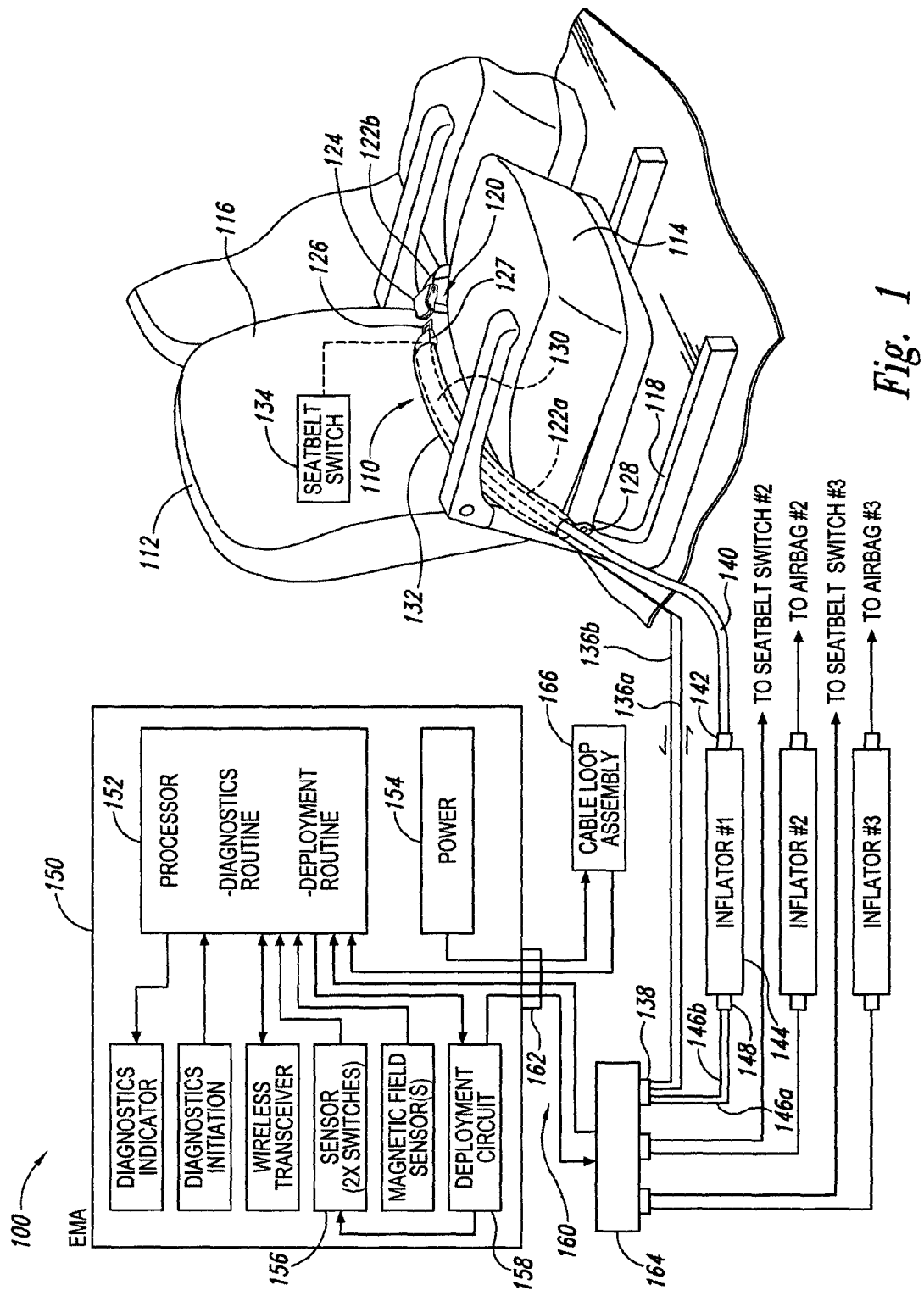
FIG. 1 is a partially schematic isometric view of a personal restraint system in accordance with an embodiment of the disclosed technology.

FIG. 1 is a partially schematic isometric view of a seating area in a vehicle (e.g., an aircraft) having one or more seats 112 provided with an inflatable personal restraint system 100 ("restraint system 100") configured in accordance with an embodiment of the present technology. In one aspect of the illustrated embodiment, the seats 112 can be at least generally similar to conventional seats in, for example, a commercial aircraft. Accordingly, each of the seats 112 includes a back portion 116 extending upwardly from a seat portion 114, and each seat 112 is fixedly attached to the floor of the aircraft by a suitable seat mounting structure 118. Although certain embodiments of the present technology are described herein in the context of personal restraint systems for use in commercial aircraft, those of ordinary skill in the art will appreciate that the various structures and features of the personal restraint systems described herein can also be utilized in a wide variety of other vehicles, including other aircraft (e.g., private and military aircraft), ground vehicles (e.g., automobiles, trucks, buses, trains, motor homes), water vehicles, etc.

In another aspect of the illustrated embodiment, the restraint system 100 includes an airbag assembly 110 carried on a seat belt 120. More specifically, in the illustrated embodiment, the seat belt 120 includes a first web portion 122a and a corresponding second web portion 122b. A proximal end portion of the first web portion 122a can be fixably attached to the seat mounting structure 118 by means of a hook 128 or other suitable device known in the art. The proximal end portion of the second web portion 122b can be similarly attached to the seat mounting structure 118 on the opposite side of the seat 112. The distal end portion of the first web portion 122a carries a connector 126 having a tongue portion. The distal end portion of the second web portion 122b carries a corresponding buckle 124 configured to receive and releasably engage the tongue portion of the connector 126 to couple the two web portions 122a, 122b together around a seat occupant (not shown) in a conventional manner. In certain embodiments, the connector 126 and the buckle 124 can be configured to operate in a manner that is at least generally similar to conventional connector/buckle assemblies found on conventional seat belts.

In a further aspect of the illustrated embodiment, the airbag assembly 110 includes an airbag 130 that is attached to the first web portion 122a generally proximate the connector 126. In one embodiment, for example, the airbag 130 can be fastened to the first web portion 122a using the methods and systems disclosed in U.S. patent application Ser. No. 13/086,134, which was filed Apr. 13, 2011 and is incorporated herein in its entirety by reference. In FIG. 1, the airbag 130 is illustrated in the nondeployed configuration in which it is folded neatly and stowed beneath a flexible and durable cover 132. The cover 132 encloses the airbag 130 and the first web portion 122a and extends from a back shell 127 on the connector 126 to a position adjacent to the hook 128. The cover 132 includes one or more tear seams (not shown) that are designed to rupture upon airbag inflation enabling the airbag 130 to fully inflate.

In another aspect of the illustrated embodiment, the airbag assembly 110 further includes an inflator hose 140 having a first end portion in fluid communication with the interior of the airbag 130, and a second end portion that carries a coupling 142. The coupling 142 is configured to be operably (e.g., threadably) engaged with an outlet of an airbag inflator 144. Various types of inflators can be used with the airbag systems described herein. In certain embodiments, the inflator 144 can include a stored gas canister that contains compressed gas (e.g., compressed air, nitrogen, argon, helium, etc.) that can be released upon electrical initiation of a corresponding pyrotechnic device (e.g., a squib). Suitable inflators can be provided by, for example, Autoliv Inc. of Ogden Technical Center 3350 Airport Road Ogden, Utah, USA 84405. In other embodiments, other suitable inflator devices can be used without departing from the scope of the present disclosure. Such inflator devices can include, for example, gas generator devices that generate high pressure gas through a rapid chemical reaction of an energetic propellant. Accordingly, the present disclosure is not limited to a particular type of inflator device.

In yet another aspect of the illustrated embodiment, the airbag assembly 110 includes a seat belt switch 134 carried on the web connector 126. In the illustrated embodiment, the seat belt switch 134 is configured to change status when the connector 126 is suitably engaged with the buckle 124. For example, in one embodiment of the present disclosure, the seat belt switch 134 can be a "normally closed" switch (e.g., a normally closed reed switch) that "opens" when the connector 126 is engaged with the buckle 124. The opening of the seat belt switch 134 can be effectuated by a magnet (not shown) carried on the buckle 124. When the connector 126 is properly engaged with the buckle 124, the seat belt switch 134 is moved into the field of the magnet, thereby causing the switch to open.

When the seat belt switch 134 is closed (i.e., when the connector 126 is not engaged with the buckle 124), the seat belt switch 134 completes a circuit comprised of a pair of wires including a first wire or lead 136a and a second wire or lead 136b. The first and second wires 136a, 136b terminate in an electrical connector 138. A second pair of wires 146a, 146b also terminates in the electrical connector 138. A distal end portion of the second pair of wires 146 carries an electrical connector 148 configured to be operably coupled to an ignitor or bridge wire in the inflator 144. In other embodiments, the seat belt switch 134 can be a "normally open" switch (e.g., a normally open reed switch), that is magnetically closed when the connector 124 is properly engaged with the buckle 124.

In a further aspect of the illustrated embodiment, the airbag system 100 includes an electronic module assembly (EMA) 150 for controlling the deployment of the airbag 130 during a rapid deceleration event (e.g., a crash) of sufficient magnitude. The EMA 150 is operably coupled to the airbag assembly 110 via a cable assembly 160. The cable assembly 160 includes a first connector 162 that is plugged into the EMA 150 and a second connector 164 that provides a receptacle for the airbag electrical connector 138. In the illustrated embodiment, the EMA 150 includes a programmed processor 152 that receives electrical power from a power source 154 (e.g., one or more lithium batteries).

In certain embodiments, the cable assembly 160 can include a cable loop 166 that completes the circuit from the power source 154 to the programmed processor 152 and other components within the EMA. In one aspect of this embodiment, this approach can conserve a significant portion of battery life because the power source 154 is isolated from the processor 152 and other components in the EMA 150 until the cable assembly 160 is plugged into the EMA 150. Therefore, power is not drawn from the batteries until the device is installed on the vehicle or aircraft and the cable loop 166 completes the circuit. Though shown schematically, the EMA 150 can include a protective housing that contains the various electronics, circuitry, and associated devices contained within. When employed in, for example, a commercial aircraft, the EMA 150 can be mounted to a rigid structure beneath the seat 112.

In another aspect of the illustrated embodiment, the EMA 150 includes a crash sensor 156 that detects rapid deceleration along a particular axis (e.g., an axis of forward motion of the vehicle). Moreover, in this embodiment, the crash sensor 156 can include two individual sensor switches aligned along a common axis for additional safety, as will be explained below. The sensor switches can be virtually any type of suitable switch known in the art for responding to a rapid deceleration (or acceleration) event, including magnetically activated reed switches and/or hall effect switches.

In operation, if the vehicle experiences a crash or other rapid deceleration event above a preset magnitude (e.g., greater than 15 g's), the sensor switches in the crash sensor 156 close and complete their corresponding circuits. One of the sensor switches causes the programmed processor 152 to detect the occurrence of a crash event. Upon confirming that the seat belt connector 126 is properably engaged with the buckle 124 (e.g., by confirming that the seat belt switch 134 is in the "open" position), the programmed processor 152 sends a corresponding signal to a deployment circuit 158. Upon receiving a signal from the programmed processor 152, the deployment circuit 158 applies a sufficient voltage to a circuit that includes the ignitor, thereby causing the inflator associated with the seat to discharge its compressed gas into the airbag 130 via the hose 140. The compressed gas expands and causes the airbag 130 to inflate and provides the seat occupant (not shown) with additional protection during the crash event.

The foregoing discussion provides a high level overview of some of the structures and functions of the personal restraint system 100 in accordance with one embodiment of the present technology. Those of ordinary skill in the art will appreciate that various aspects and features of the various subsystems of the personal restraint system 100 described above can be utilized in combination with other systems without departing from the spirit or scope of the present disclosure. For example, in certain embodiments the airbag assembly 110 described above can be used with an EMA that, rather than including a programmed processor, can simply include a power source and a crash sensor that completes a circuit to activate an inflator during a crash event. Moreover, those of ordinary skill in the art will appreciate that the EMA 150 of the illustrated embodiment includes a number of other components and features for diagnostics, redundancy, etc., which have not been described herein to avoid unnecessarily obscuring the general description of various embodiments of the present technology.

Moreover, those of ordinary skill in the art will appreciate that additional airbag assemblies 110 (e.g., a second and third airbag assembly or more) can be operably coupled to the EMA 150 for use with the other seats in the row adjacent to the seat 112. Accordingly, in one embodiment, if a row of seats in an aircraft includes three seats, each seat can be outfitted with a seat belt airbag assembly as described above, with each of the airbag assemblies coupled to an individual inflator as illustrated in FIG. 1. All three of the airbag assemblies, however, can be initiated by the single EMA 150.

In one embodiment, the crash sensor 156 includes two reed switches that are aligned along a common axis. In one embodiment, a magnet is oriented so that it is moved by the force of a sudden deceleration or acceleration from a resting position to an active position over the reed switches. The magnetic field of the crash sensor magnet causes the reed switches to close and complete circuits within the EMA 150. Because the reed switches in the crash sensor 156 are susceptible to magnetic fields, the EMA 150 includes one or more external magnetic field sensors 200. The magnetic field sensors are positioned such that they will be activated by any external magnetic fields that may interfere with the operation of the crash sensor 156. Such magnetic fields could be produced by strong magnets of the type found in loudspeakers or the like.

In another embodiments, the crash sensor 156 can include a pair of reed switches that are shielded from a fixed magnet by a movable shield biased with a spring such as disclosed in U.S. patent application Ser. No. 13/170,179, filed Jun. 27, 2011, and which is herein incorporated by reference.

Because the personal restraint systems remain primed until the moment they are needed, it is important to periodically test the readiness of the systems. Therefore, the EMA includes built-in diagnostic capabilities. In one embodiment, the programmed processor within the EMA 150 tests the capacity of the power supply to deliver the appropriate current required to actuate the ignitors of the personal restraint systems and to test the integrity of the igniter circuits as well as the circuitry that detects if a seat belt associated with an airbag assembly is fastened.

In one embodiment, the EMA 150 includes a diagnostic initiation button 204 (FIG. 3) that can be pressed by a technician to initiate a diagnostic routine that is implemented by the programmed processor 152. The results of the diagnostic self-test routine are displayed on a number of diagnostic indicators 206 (FIG. 3) associated with each personal restraint system and the EMA 150 itself. In one embodiment, the diagnostics indicators 206 comprise single or multicolored LED lights that change color and/or illumination patterns (i.e., flashing versus continually on etc.) to indicate the results of the diagnostic test routines. During use, a maintenance technician manually presses the diagnostic test initiation button on each of the EMAs in the aircraft and records the results of the diagnostic test on paper or with an electronic recording device.

The EMA 150 also includes a wireless transceiver 208 (FIG. 3) that can be used to receive requests to initiate a diagnostic routine and to transmit the results of the diagnostic routines to the corresponding wireless interrogator that is carried by a maintenance technician who is responsible for checking the readiness of the personal restraint systems. Alternatively, the requests to initiate a diagnostic routine and the results of the diagnostic routines can be transmitted via the wireless transceiver 208 to a remote computer system such as the cabin management system (not shown) found on an aircraft.

Figure 2:
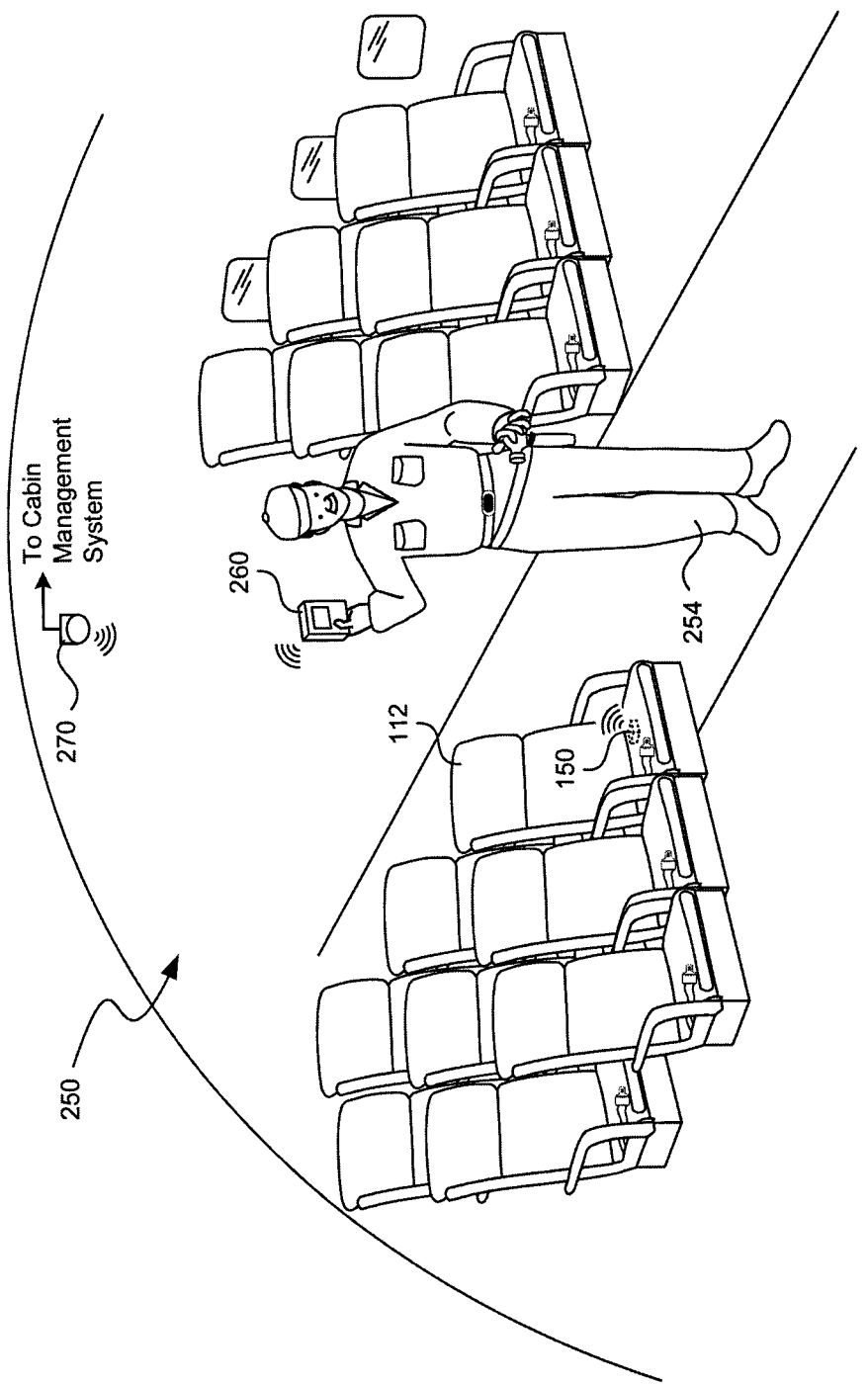
FIG. 2 illustrates how a maintenance worker can check the readiness of a number of personal restraint systems in an aircraft in accordance with an embodiment of the disclosed technology.

FIG. 2 illustrates an environmental view of a maintenance technician 254 within an aircraft 250 according to an embodiment of the disclosed technology. In this embodiment, the technician 254 is tasked with recording the results of the diagnostic tests performed by each of the EMAs associated with the personal restraint system in each of the seats 112. In the embodiment shown, the technician 254 carries a wireless interrogator 260 such as a special purpose device or a general purpose device (laptop computer, tablet computer, smart phone or the like). The interrogator 260 sends a signal to each of the EMAs to perform a number of diagnostic tests and records the results of the diagnostic tests performed. In one embodiment, each EMA is assigned a unique identification code or serial number that is stored in a non-volatile memory. The wireless interrogator 260 sends a code to the EMA and the EMA having the matching code performs the diagnostic tests and returns the results to the wireless interrogator 260.

In one embodiment, testing of the personal restraint systems is performed at periodic intervals such as every 4,000 flight hours or approximately once a year. As an alternative to using a wireless interrogator 260, the individual EMAs can communicate with one or more antennas 270 disposed within the aircraft. Each of the antennas 270 is connected by a wired or wireless connection to a centralized computer system such as the cabin management system of the aircraft. The cabin management system computer can communicate with each of the EMAs in order to cause each EMA to perform its diagnostic test routines and report the results of the diagnostic tests performed. The cabin management system can provide an alert to the crew of the aircraft or to aircraft maintenance personnel that indicates if a personal restraint system in any of the seats is not functioning properly.

Figure 3:
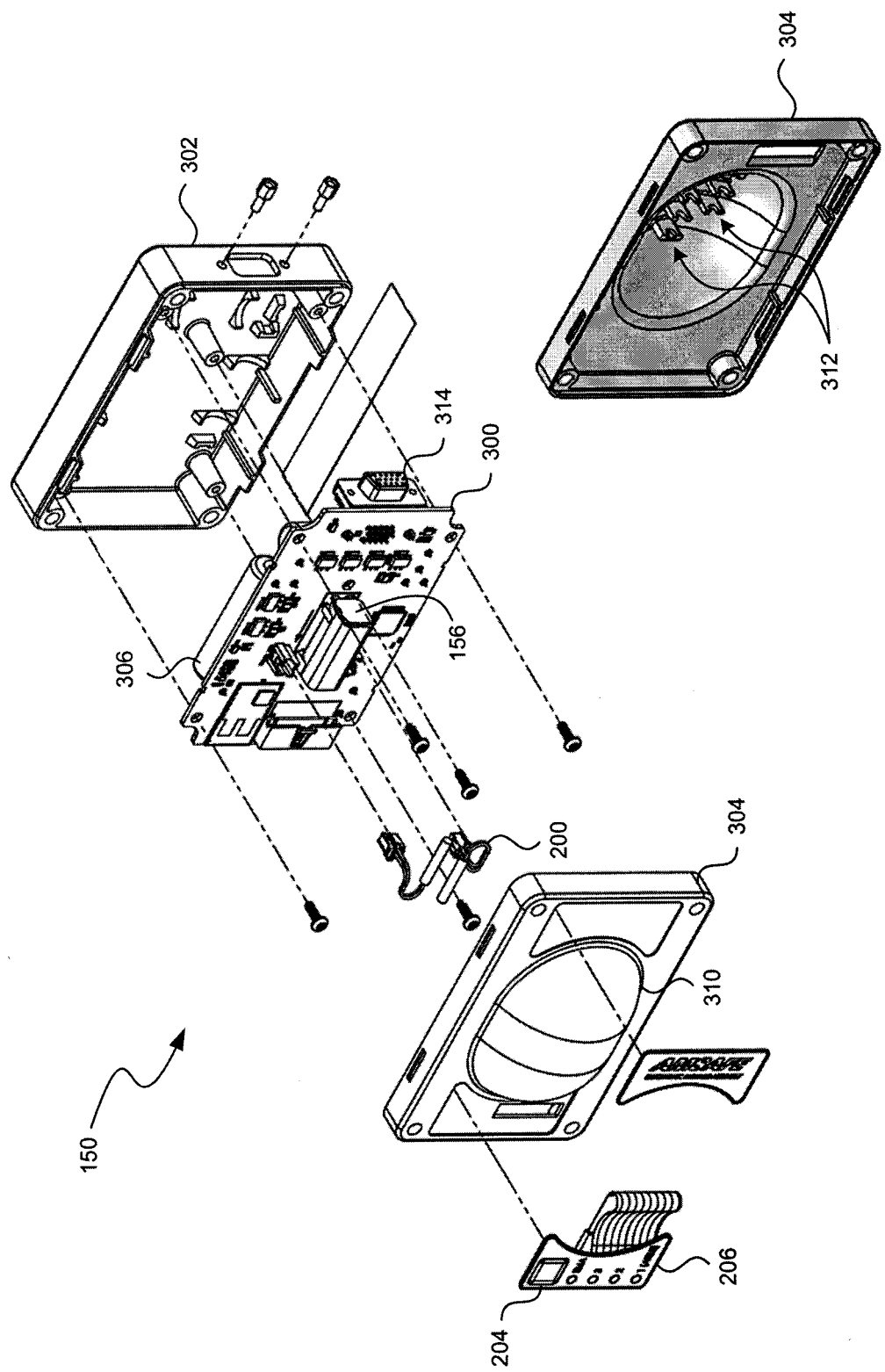
FIG. 3 illustrates an electronic module assembly (EMA) for deploying a number of personal restraint systems in accordance with an embodiment of the disclosed technology.

FIG. 3 illustrates one embodiment of an EMA 150 that contains the electronic components used to test and deploy a number of personal restraint systems. In one embodiment, the electronics for the personal restraint system are mounted on a printed circuit board 300, which is fitted in an enclosure box having a first half 302 and a second upper half 304. The printed circuit board 300 supports a number of power cells such as lithium batteries 306 and the crash sensor 156 as well as other components. In the embodiment shown, the second half 304 of an enclosure box includes a domed surface 310 that fits over the crash sensor 156. The domed surface 310 operates to create a physical space between objects that may be positioned against the enclosure box of the EMA. The size of the physical space created by the domed surface 310 is selected to prevent external magnetic fields from interfering with the operation of the crash sensor 156. In one embodiment, the domed surface 310 supports the external magnetic field sensors 200. In one embodiment, the magnetic field sensors 200 are secured in supports 312 that are formed on the inner or concave side of the domed surface 310. With the external magnetic field sensors secured in the supports 312, the magnetic field sensors 200 are positioned within any external magnet field that may interfere with operation of the crash sensor 156 and EMA 150. A connector 314 is provided on the printed circuit board 300 for connecting the EMA 150 to a cable assembly that extends to each of the personal restraint systems. In the embodiment shown, the EMA '150 includes an electronic switch that operates as the diagnostic initiation button 204 and a number of diagnostic indicators 206, such as LEDs, that visually indicate whether the EMA and each of the personal restraint systems controlled by the EMA is operating properly.

Figure 4A:
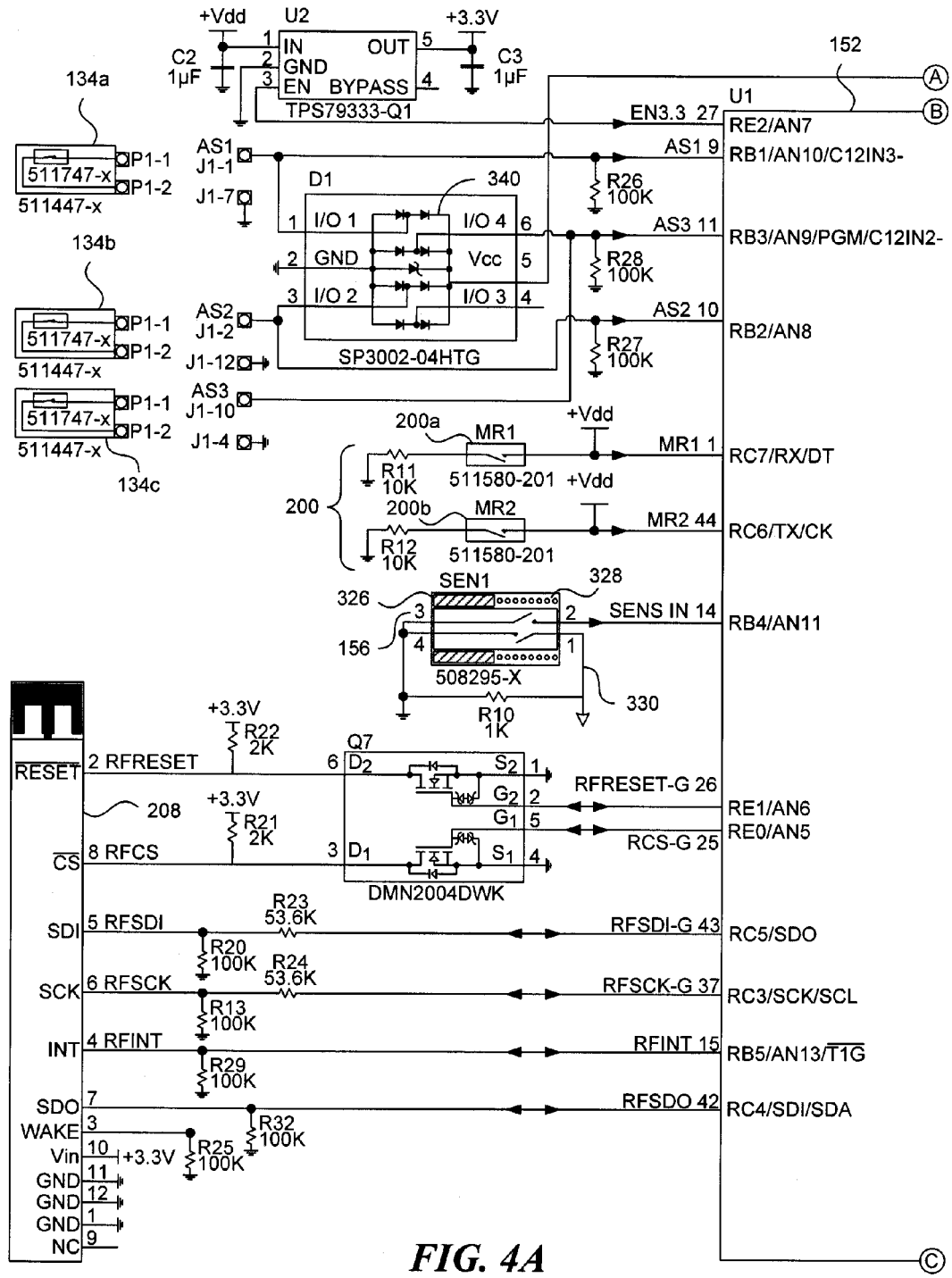
FIGS. 4A-4C are block electrical diagrams of a circuit for deploying one or more personal restraint systems and for performing a diagnostic self-check in accordance with an embodiment of the disclosed technology.
Figure 4B:
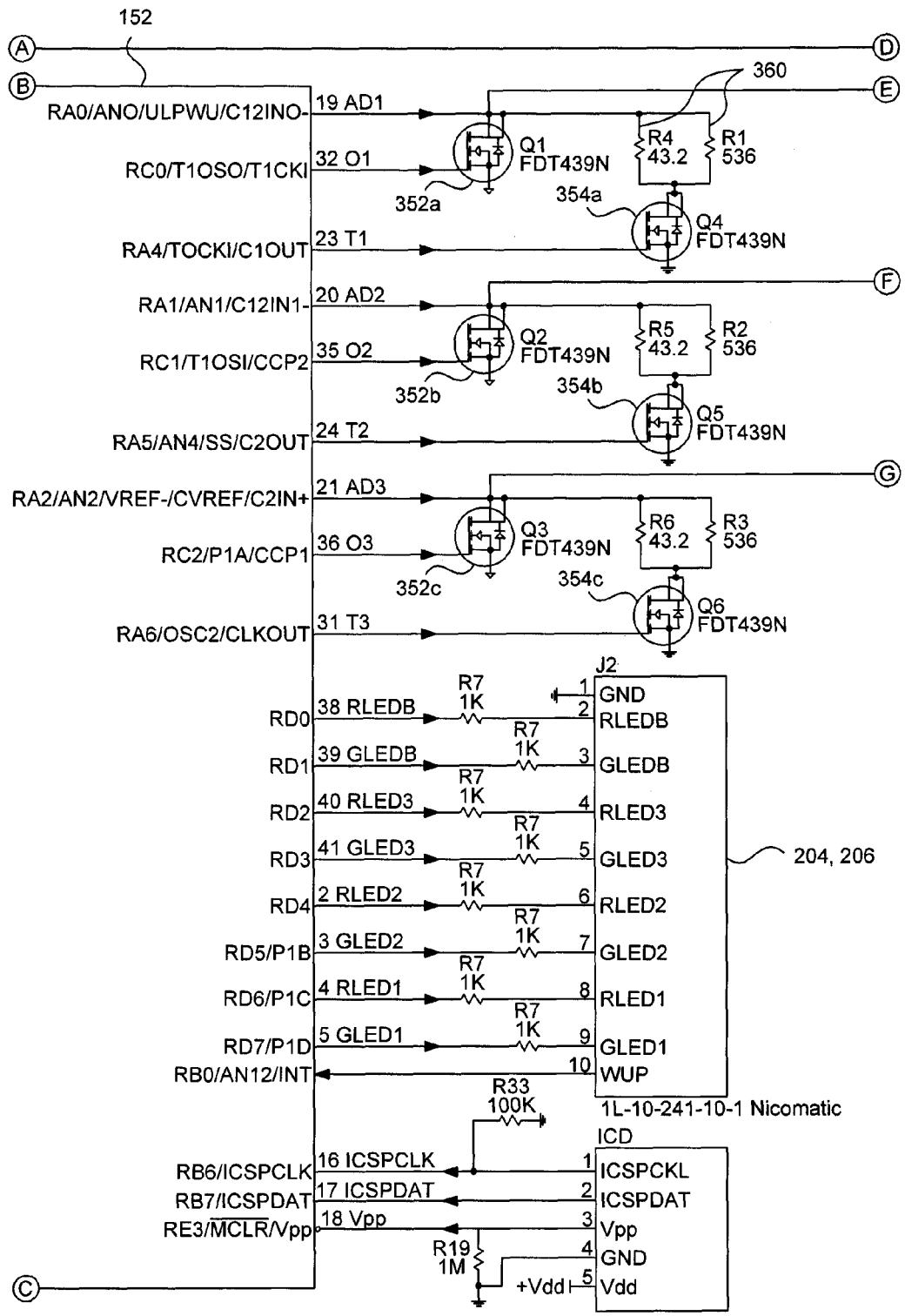
Figure 4C:
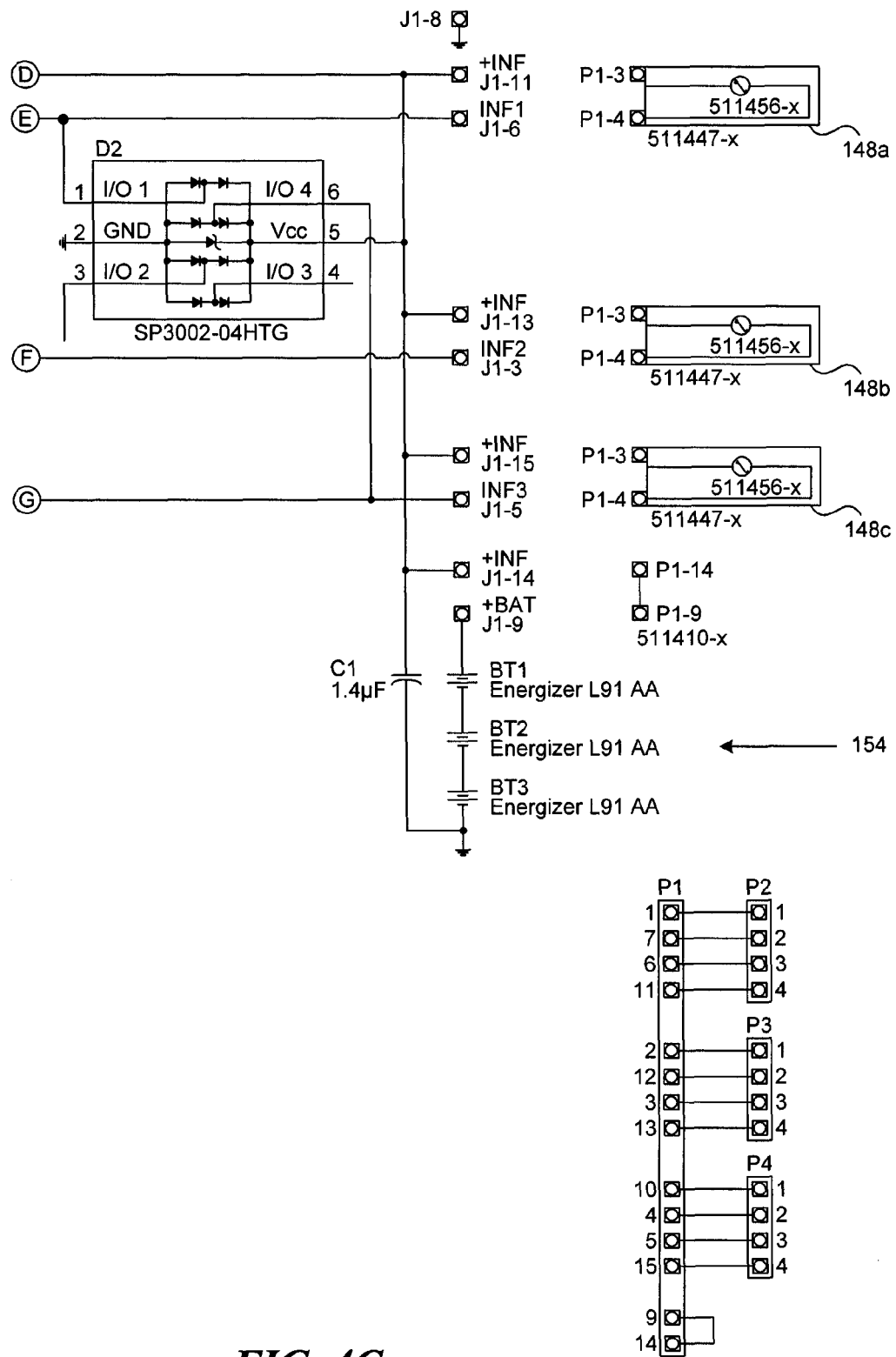

FIGS. 4A-4C are block diagrams of a representative arrangement of electronic components within the EMA that operate to deploy the personal restraint systems. In one embodiment, a programmed processor 152 comprises a PIC16F884 microcontroller. Power is supplied to the programmed processor from a number of lithium battery cells 154 that are connected in series. Regulated power is supplied to the programmed processor and other circuits from a voltage regulator circuit 320. The voltage regulator circuit 320 is configured to receive the battery voltage from the battery cells 154 at an input and produces a regulated 3.3 volts at an output for use by the programmed processor and a wireless transceiver circuit 208.

As indicated above, in one embodiment, the crash sensor 156 comprises a pair of magnetically activated reed switches that are aligned along a common axis. An annular magnet 326 is biased away from the switches by a spring 328. When the crash sensor 156 is exposed a force of the type generated during a crash or other rapid deceleration/acceleration, the spring 328 of the crash sensor is compressed by the mass of the annular magnet 326, thereby allowing the magnet 326 to move over the reed switches. The magnetic field from the annular magnet 326 causes the reed switches to change state i.e., to either open or close. In one embodiment, the switches are closed when the magnet 326 is positioned over the reed switches of the crash sensor 156. In one embodiment, a first reed switch of the crash sensor is connected between an interrupt pin on the programmed processor 152 and ground. When closed by the magnet of the crash sensor, the first reed switch connects the interrupt pin to circuit ground in order to signal to the programmed processor that a crash or other rapid deceleration/acceleration event is occurring. The other reed switch of the crash sensor 156 is connected in parallel with a 1 kilo-ohm resistor to circuit ground. The second reed switch functions as a safety mechanism to prevent accidental deployment of the personal restraint systems as will be described in further detail below. The external magnetic field sensors 200 are also connected between circuit ground and separate inputs of the programmed processor 152. In one embodiment, each magnetic field sensor includes a reed switch that changes state when exposed to an external magnetic field. Each switch of the external magnetic field sensors has one terminal connected to an input of the programmed processor and a second terminal coupled to circuit ground through a 10 kilo-ohm resistor. The inputs to the processor 152 coupled to terminals of the external magnetic field sensors 200 are tied at $+V_{dd}$. When the switches of the external magnetic field sensors 200 are open, the inputs to the programmed processor read at the $+V_{dd}$ level and when the switches of the external magnetic field sensors 200 are closed, the inputs to the programmed processor 152 are grounded.

The programmed processor 152 also has inputs connected to the magnetically activated reed switches found in each of the seat belts. For example, a switch 134a is in the seat belt for use with seat 1 while a switch 134b is in the seat belt for use with seat 2 and a switch 134c is in the seat belt for use with seat 3. One lead wire connecting to each of the seat switches 134a-134c is grounded while another wire connecting to the switch is connected to an input on the programmed processor 152. A diode protection circuit 340 is provided such that each of the lead wires that couple an input of the programmed processor 152 to a seat belt switch is connected between a pair of reverse biased diodes. The cathode side of a first one of the diodes is connected to the battery voltage and the anode side of the first diode is connected to the cathode side of a second diode. The anode side of the second diode is grounded. As will be appreciated by those skilled in the art, the voltage on a common node at a point between the diodes to which the input of the programmed processor is connected is therefore limited to one diode drop below ground level and one diode drop above the battery voltage. The diode protection circuit shields the programmed processor from electromagnetic interference (EMI) signals that may be induced on the lead wires extending to the seat belts. Also connected in parallel with the lead wires to the seat belt switches (i.e between the inputs to the programmed processor and ground) are 100 kilo-ohm resistors.

When the seat belt switches are in their normally closed state, the voltage supplied to the inputs of the programmed processor is 0 volts or ground potential. When the seat belt switches are in the open state, the voltage at the inputs to the programmed processor 152 rises. Therefore, by reading the voltages on the input pins of the programmed processor, the programmed processor can detect whether the seat belt switches are in the open or closed state. By having the seat belt switches operate in a normally closed manner, the programmed processor can detect an open circuit in a lead wire and a defective seat belt switch simply by detecting if the inputs at the programmed processor are grounded when the seat belt is not buckled. If a normally open switch were used, additional test steps or leads would be required to differentiate between open circuits due to a broken wire or a malfunctioning seat belt switch.

The lead wires for the switches 134b and 134c found in the seat belts associated with seats 2 and 3 are connected in the same manner.

To deploy a personal restraint system, the EMA 150 includes a transistor associated with each inflator. In one embodiment, each ignitor is connected to a pair of lead wires. One lead wire is coupled to the battery voltage Vcc, while the second lead is connected to the transistor 352. For example, ignitor 148a has one lead wire connected to Vcc and a second lead wire connected to the drain of transistor 352a. A gate of the transistor 352a is coupled to an output of the programmed processor 152, such that upon application of a suitable logic level to the gate, the transistor turns on and allows current to flow through the ignitor. When the transistor 352a is turned on, a current path is formed through the igniter or bridge wire between the batteries to ground. In one embodiment, the application of at least 1.2 amps of current through the ignitor for 2 milliseconds is required to cause the corresponding inflator to activate and fill the airbag with gas. In one embodiment, the source of the transistor 352*a* is not connected directly to ground but is connected through the second reed switch (point 330 in FIGS. 4A-4C), associated with the crash sensor 156 so that current will not flow through the transistor unless the second reed switch of the crash sensor 156 is closed. This acts as an additional safety device such that if the programmed processor inadvertently applies a voltage level that could turn on the transistor 352*a* when the crash sensor 156 is not activated, current cannot flow through the ignitor and the inflator will not activate. The ignitors 148*b* and 148*c* associated with the inflators for seats 2 and 3 are connected in the same way as the ignitor 148*a*.

The EMA 150 also includes a second transistor for each personal restraint system to test the ability of the batteries to deliver a sufficient current to the ignitors and to test the integrity of lead wires that connect to the ignitors. To test the personal restraint systems for seat 1, the EMA includes a transistor 354*a*. The source of the transistor 354*a* is grounded while the drain is connected to a pair of parallely connected resistors 360 that connect to the ignitor. A gate of the transistor 354*a* is connected to an output of the processor 152 such that upon application of a suitable voltage at the gate, the transistor 354*a* is turned on and current flows through the ignitor and through the parallely connected resistors to ground. The current generates a voltage at the resistors that is read at an analog-to-digital converter input pin of the programmed processor 152. By reading the voltage generated, the processor can determine if the ignitor and the lead wires that connect to the ignitor are intact. The voltage read should be some predefined percentage of the battery voltage depending on the relative values of the resistance of the ignitor and the resistance of the parallely connected resistors. The parallely connected resistors also serve to limit the current that flows through the ignitor so that the inflator will not activate during a self-test routine.

To detect if the battery has a sufficient voltage required to actuate the ignitors, both the transistors 352*a* and 354*a* are turned off by the programmed processor 152 and the voltage on the lead that connects the programmed processor to the ignitor is read at an analog-to-digital converter input pin. In one embodiment, the analog-to-digital converter compares the voltage read with the reference voltage Vdd supplied by voltage regulator 320. In one embodiment, programmed processor 152 is programmed to divide Vdd by the digital value of the voltage detected when both transistors 352 and 354 are turned off and to multiply the result by 1,024. If the ratio is greater than a predefined limit (i.e., the battery voltage is getting smaller), then an error condition is detected indicating that the batteries of the EMA 150 should be changed.

The circuits for activating and testing the leads and ignitors for the other personal restraint systems that are controlled by the EMA 150 are connected in the same manner.

In one embodiment, the EMA circuit 150 includes a wireless transceiver 208. In one embodiment, the wireless transceiver 208 is a MRF24J40MA 2.4 GHz chip produced by Microchip Corporation. The wireless transceiver operates to transmit wireless signals via the IEEE 801.15 protocol. In one embodiment, the wireless transceiver 208 is used to detect signals from a wireless interrogator (e.g., from either a handheld wireless interrogator 260 or from a cabin management computer system). Upon receipt of a wireless signal, the EMA begins performing a diagnostic routine and reports the results of the diagnostic routine under the control of the programmed processor. The connection and operation of a wireless transceiver with the programmed processor 152 is considered to be well known to those of ordinary skill in the art and need not be discussed in further detail.

Figure 5:
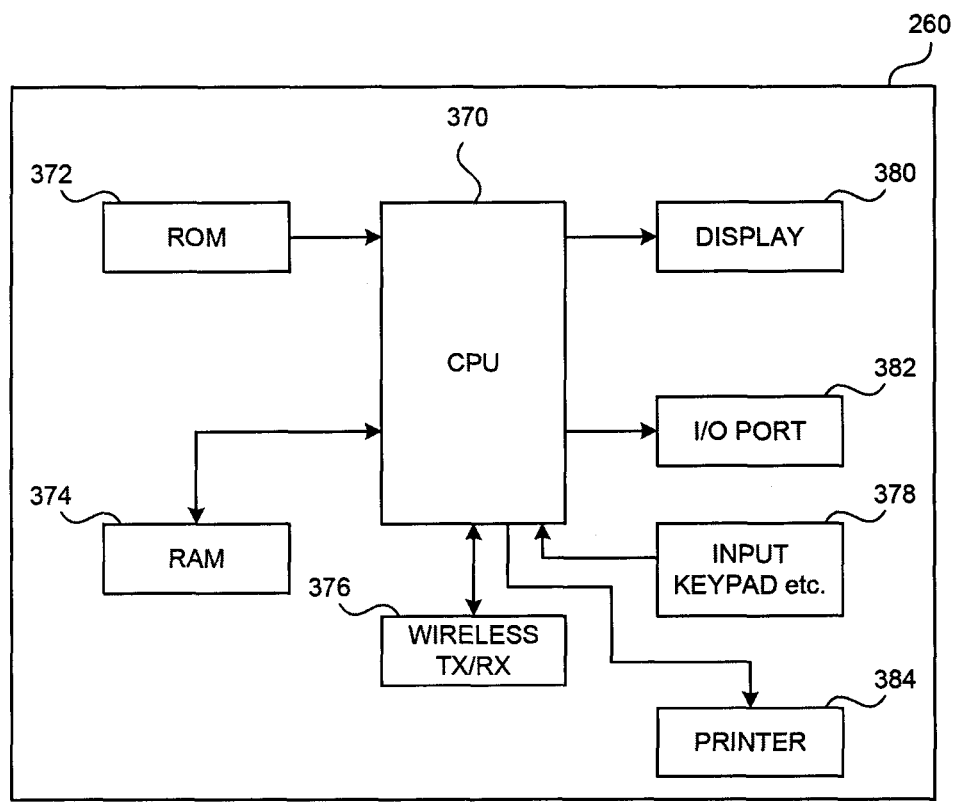
FIG. 5 is a block diagram of a handheld wireless interrogator for recording the results of a diagnostic self-check performed by a number of EMAs in accordance with an embodiment of the disclosed technology.

FIG. 5 is a block diagram of the handheld wireless interrogator 260 used by a maintenance technician or other individual to check the readiness of each of the personal restraint systems in a vehicle.

In one embodiment, the handheld wireless interrogator 260 includes one or more programmed processors 370 having built-in or external non-transitory, read-only memory (ROM) 372 and random access memory (RAM) 374. The read-only memory 372 stores a sequence of program instructions that cause the handheld wireless interrogator 260 to instruct each EMA on a vehicle to perform the diagnostic self-tests for each personal restraint system and records the results of the completed diagnostic tests. The random access memory 374 may be used to store the results of the diagnostic tests from each EMA for later delivery to other systems or computers and/or for printing a report.

The programmed processor 370 receives input commands from an input device 378 such as a keypad, touch sensitive screen, buttons, dials or the like. A display 380 is used by the programmed processor 370 to present a suitable user interface that instructs an operator how to use the device and confirms that each EMA has been interrogated. In addition, the display can show the results of the diagnostic self-tests performed by each EMA. If repairs or adjustments need to be made to an individual personal restraint system, the display can inform the technician what maintenance steps should be performed and can keep records of the time and date when any maintenance was performed.

In one embodiment, results of the diagnostic self-test routines received from each EMA are delivered to a remote computer system or other device via an input/output port 382. The input/output port may be a USB port, network connection, serial port or the like. The handheld wireless interrogator 260 may also include a wireless transmitter/receiver 376 that is used to communicate with the EMAs and also to transfer the results of the diagnostic self-tests performed by each EMA to a remote wireless equipped computer system. The handheld wireless interrogator 260 may also include a small printer 384 used to print a hard copy of the diagnostic self-test results received from each of the EMAs. Such a printer may be the type commonly found in credit card point of sale devices or the like. Although not shown, the wireless interrogator 260 may also include the appropriate hardware and software to allow the device to communicate via other modes such as cellular, Bluetooth or the like.

Although the wireless interrogator 260 shown in FIG. 5 is described as a special purpose device, it will be appreciated that a general purpose device such a portable computer (laptop, tablet etc.) or other device (smartphone, PDA etc.) with built-in or connected wireless communication capability could be used.

Figure 6:
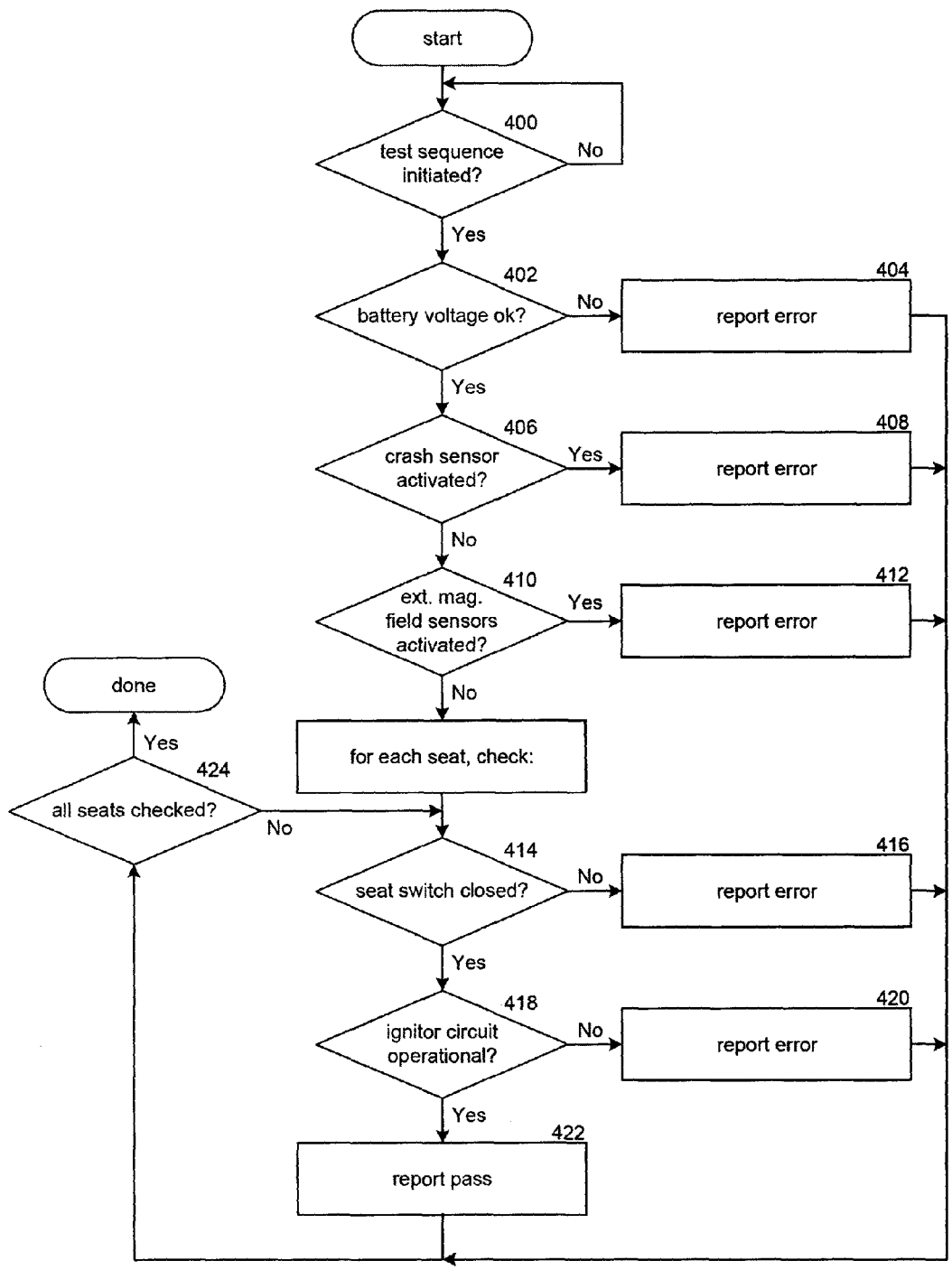
FIG. 6 is a flow diagram of steps performed by a programmed processor within an EMA to perform a diagnostic self-check in accordance with one embodiment of the disclosed technology.

FIG. 6 is a flow diagram of steps performed by a programmed processor in an EMA to perform a diagnostic self-test routine. Although the steps are shown and described in a particular order for ease of explanation, it will be appreciated that the steps could be performed in a different order or additional or alternative steps performed in order to achieve the functionality described. In one embodiment, the programmed processor executes programmed instructions that are stored on a non-transitory, computer readable media in order to implement the functionality described.

Beginning at 400, the programmed processor determines if a diagnostic routine has been requested. Such a request may be received in response to a service technician activating a switch or pressing a button on the EMA. In another alternative embodiment, the request to initiate a diagnostic self-test is received in a wireless signal that is transmitted from a handheld wireless interrogator device or from another computer system such as a cabin management system, etc. Once a request to initiate a diagnostic self-test is received, the programmed processor determines if the battery voltage of the EMA is within an acceptable range at 402. If the battery voltage is not acceptable, an error is reported at 404. If the battery voltage is acceptable, the processor determines if the switches in the crash sensor are un-activated (e.g., are open) at 406. If the crash switches are activated, an error is reported at 408. If the switches of the crash sensor are not activated, the programmed processor determines if the switches of the external magnetic field sensors are not activated (e.g., are open) at 410. If one or both of the switches in the external magnetic field sensors are detected as being activated (e.g. closed) at step 410, then an error is reported at 412.

Once the battery, crash sensor and external magnetic field sensors have been tested, the seat switch and ignitor circuits for each personal restraint system controlled by the EMA are tested. At 414, the processor determines if the seat switch in the seat belt is closed. If not, an error is reported at 416. If the seat switch is closed, the processor determines at 418 if the ignitor wire has the expected resistance and the leads to the ignitor are not broken as described above. If the resistance of the ignitor is not as expected, an error is reported at 420. If the seat switch and ignitor circuits pass the diagnostic tests, the programmed processor reports a pass condition for the personal restraint system associated with that particular seat at 422.

At 424, the programmed processor determines if all the personal restraint systems have been tested. If so, the diagnostic routine for that particular EMA is complete. If not, the personal restraint system for the next seat is tested. As indicated above, the status of the diagnostic self-test routine may be reported by lighting or displaying one or more LEDs in a particular pattern or with a particular color. For example the EMA may light a green LED for each seat if the system passes or light a red if the system fails. Alternatively, other cues such as flashing orange LEDS could be used to indicate particular problems such as low battery voltages, problems with the crash or external magnetic field sensors or problems with the ignitors, etc.

Figure 7:
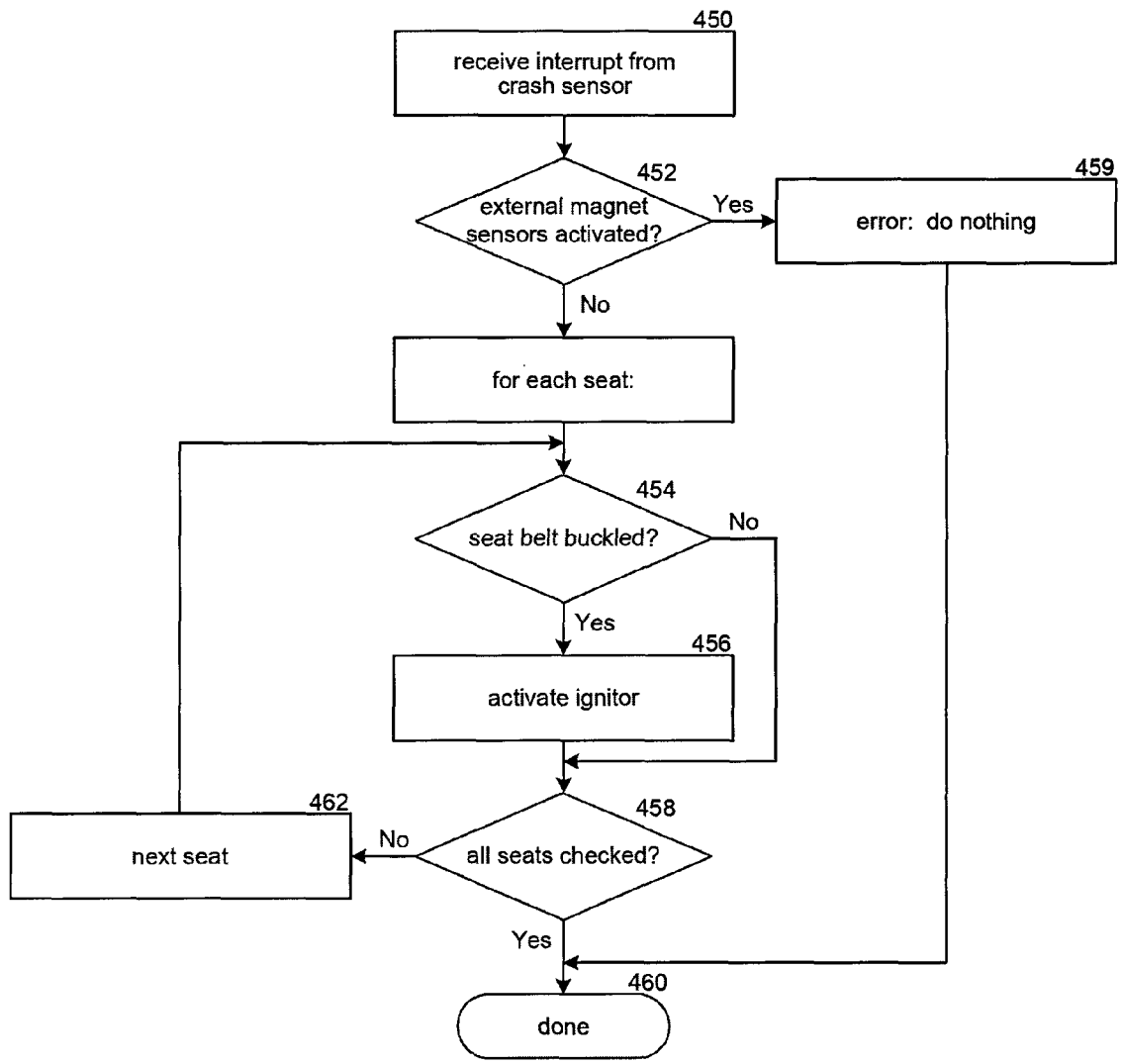
FIG. 7 is a flow diagram of steps performed by a programmed processor within an EMA to deploy a personal restraint system in accordance with an embodiment of the disclosed technology.

FIG. 7 illustrates steps performed by the programmed processor in accordance with one embodiment of the disclosed technology to deploy a personal restraint system in a seat.

Beginning at 450, the programmed processor receives an interrupt signal from a crash sensor indicating that a crash or rapid deceleration/acceleration event has occurred that requires the deployment of one or more of the personal restraint systems. At 452, the programmed processor determines if the switches of the external magnetic field sensors are activated. If the switches of the external magnetic sensors have been activated, the programmed processor assumes that an external magnetic field is interfering with the crash sensor. An error is therefore detected and no deployment of the personal restraint devices is performed at 454. If the external magnetic sensors have not been activated by an external magnetic field, then for each seat, the processor determines if the seat belt for the associated seat is buckled at 454. If the belt is not buckled, then the personal restraint system for that particular seat is not activated. If the seat belt is detected as being buckled by the opening of the magnetic reed switch in the tongue portion of the buckle, then the ignitor for that particular seat is activated at 456.

At 458, the programmed processor determines if all seats have been checked. If so, processing ends at 460. If not, processing returns to the next seat at 462. Steps 454-458 are then repeated for each seat until the personal restraint system for each seat has been deployed or not deployed depending upon whether the seat belt associated with the seat is buckled or unbuckled.

In one embodiment, seats that do not have their seat belt fastened do not have their personal restraint system deployed. This can act as a safety feature. For example, in some instances, car seats or infant carriers are secured to a seat with a seat belt. Personal restraint systems are generally not used when infants or small children are placed in a seat. In such cases, a seat belt extender is used to secure such a car seat or infant carrier to the seat. The seat belt extender does not include a magnet in the buckle that will open the reed switch in the tongue portion of the seat belt. Therefore, if a seat belt is detected as being unbuckled, the programmed processor assumes that either the seat is empty and therefore the personal restraint system need not be deployed or that a seat belt extender is in use and therefore the personal restraint system should not be deployed.

In one embodiment, each EMA enters a periodic sleep mode when not listening for a diagnostic initiation signal in order to extend the battery life. In one implementation, each EMA is programmed to wake up for a short period every five minutes and listen for a code that indicates a diagnostic check of the EMA's is beginning. The code may be the aircraft tail number in which the EMA's are installed. The interrogator broadcasts this code continuously for five minutes each time a diagnostic check of the EMA's is to begin. Each EMA listens for the code and if detected stays awake for the broadcast of a unique code that identifies the particular EMA. Upon receipt of the unique code, the EMA performs the diagnostic check and returns the results to the interrogator. The interrogator then instructs the particular EMA to go back to sleep.

When the last diagnostic check result is received, the interrogator 260 broadcasts a "go to sleep" signal that instructs any remaining EMA's that are still awake to go back to sleep.

As can be seen from the above description, the disclosed technology provides a simple, cost-effective mechanism to control the deployment of personal restraint systems in a vehicle. In addition, the EMA provides a simple mechanism to initiate a diagnostic self-test routine and reporting mechanism for indicating if the personal restraint systems associated with the seats are operational. Furthermore, by the use of wireless technology, each personal restraint system can be easily checked and repaired if necessary without having to physically inspect or manipulate the controls on each EMA.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium also can be, or can be included in, one or more separate physical components or media (e.g., multiple CDs, disks, or other storage devices). The operations described in this specification can be implemented as operations performed by a data processing apparatus on data stored on one or more computer-readable storage devices or received from other sources.

The term "programmed processor" encompasses all kinds of apparatus, devices, and machines for processing data, including by way of example, a programmable microprocessor, microcontrollers, a computer, a system on a chip, or multiple ones, or combinations, of the foregoing. The apparatus can include special purpose logic circuitry, e.g., an FPGA (field programmable gate array) or an ASIC (application specific integrated circuit). The apparatus also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display), LED (light emitting diode), or OLED (organic light emitting diode) monitor, for displaying information to the user and a keyboard and a pointing device, e.g., a mouse or a trackball, by which the user can provide input to the computer. In some implementations, a touch screen can be used to display information and to receive input from a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include any number of clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. An electronic module assembly for controlling the deployment of one or more personal restraint systems in a vehicle, comprising:

a power source for supplying electrical power to one or more personal restraint systems;
a crash sensor configured to produce an electronic signal upon exposure to a determined force;
a wireless transceiver configured to receive instructions to perform one or more diagnostic self-tests
a programmed processor configured to execute instructions to:
  detect an electronic signal from the crash sensor;
  deploy one or more of the personal restraint systems upon the detection of the electronic signal from the crash sensor;
  wherein the programmed processor is further configured to execute instructions to:
    awaken from a sleep mode;
    receive a unique code that identifies the electronic module assembly;
    perform one or more diagnostic self-tests on the personal restraint systems and on the electronic module assembly to determine the ability of the electronic module assembly to deploy one or more of the personal restraint systems and to determine the ability of the power source to deploy one or more of the personal restraint systems;
    provide results of the one or more diagnostic self-tests performed; and
    return to the sleep mode after providing the results.

2. The electronic module assembly of claim 1, wherein the programmed processor is configured to transmit the results of the one or more diagnostic self-tests performed to a remote receiver with the wireless transceiver.

3. The electronic module assembly of claim 1, wherein the crash sensor includes:
  a switch configured to change state upon exposure to the determined force, wherein the switch is configured such that the personal restraint systems do not deploy unless the switch has changed state.

4. The electronic module assembly of claim 3, wherein the one or more personal restraint systems are deployed upon completion of a current path through an ignitor and wherein the current path includes a second switch that is within the crash sensor.

5. The electronic module assembly of claim 1, wherein each of the personal restraint systems is mounted on a seat belt of a vehicle and wherein the seat belt includes a seat belt switch to determine if the seat belt is secured, wherein the programmed processor is configured to read a state of the seat belt switch before deploying a corresponding personal restraint system of the seat.

6. The electronic module assembly of claim 5, wherein the seat belt switch is closed when the seat belt is not secured and open when the seat belt is secured and wherein the programmed processor is configured to detect if the seat belt switch is secured by detecting if the seat belt switch is open.

7. The electronic module assembly of claim 1, further comprising a magnetic field sensor that is configured to detect if the electronics module assembly is within an external magnetic field.

8. The electronic module assembly of claim 7, wherein the magnetic field sensor is a reed switch.

9. The electronics module assembly of claim 1, further comprising:
  a transistor and resistor in series with an ignitor hat is configured to deploy the personal restraint system, wherein the processor is configured to execute instructions that:
    turns on the transistor to conduct a current through the ignitor and that generates a voltage at the resistor; and
    reads a voltage on the resistor to determine if the power source has the ability to deploy the personal restraint system.

10. A wireless electronic module assembly for controlling the deployment of one or more personal restraint systems in a vehicle, comprising:
  a power source for supplying electrical power to one or more personal restraint systems;
  a wireless transceiver for sending and receiving information to and from a remote device;
  a deployment circuit for deploying one or more of the personal restraint systems connected to the electronics module assembly;
  a diagnostic circuit for testing the readiness of one or more of the personal restraint systems connected to the electronics module assembly, wherein the diagnostic circuit is configured to test the ability of the power source to deploy one or more of the personal restraint systems; and
  a programmed processor configured to execute instructions that cause the programmed processor to:
    awaken from a sleep mode;
    receive a unique code that identifies the electronic module assembly;
    receive instructions from the remote device to initiate a diagnostic self-test routine of the electronic module assembly and one or more of the personal restraint systems connected to the electronic module assembly;
    transmit results of the diagnostic self-test routine to the remote device with the wireless transceiver; and
    return to the sleep mode after providing the results.

11. The wireless electronic module of claim 8, further comprising:
  a memory circuit configured to store a unique identification code,
  wherein the programmed processor is configured to execute instructions that cause the programmed processor to:
    analyze codes received by the wireless transceiver from the remote device;
    compare the received codes with a code stored in the memory circuit; and
    initiate the diagnostic self-test if the received code matches the code stored in the memory circuit.

12. The wireless module assembly of claim 10, further comprising one or more visual indicators that are controllable by the programmed processor to indicate the results of the diagnostic self-test routine.

13. The wireless electronic module assembly of claim 12, wherein the one or more visual indicators are light emitting diodes.

14. A wireless interrogation device comprising:
  a wireless transceiver;
  a programmed processor configured to execute program instructions that cause the programmed processor to:
    transmit a code that identifies an electronics module assembly that controls the deployment of one or more personal restraint systems in an aircraft;
    receive diagnostic information from the electronics module assembly associated with the code indicating if the associated electronics module assembly can deploy the one or more personal restraint systems and if a power source included within the associated electronics module assembly can deploy one or more personal restraint systems associated with the electronics module assembly; and transmit a control signal to the electronics module assembly that causes the electronics module assembly to enter a sleep mode after receiving the diagnostic information.

15. The wireless interrogation device of claim 14, wherein the wireless interrogation device is handheld,

16. The wireless interrogation device of claim 14, wherein the wireless interrogation device is incorporated into a cabin management system of an aircraft.

17. An electronic module assembly for controlling the deployment of one or more personal restraint systems in a vehicle, comprising:

a power source;

a crash sensor configured to produce an electronic signal upon exposure to a determined force;

a wireless transceiver configured to receive instructions to perform one or more diagnostic self-tests a programmed processor configured to execute instructions to:

detect an electronic signal from the crash sensor;

deploy one or more of the personal restraint systems upon the detection of the electronic signal from the crash sensor;

wherein the programmed processor is further configured to execute instructions to:

awaken from a sleep mode;

receive a unique code that identifies the electronic module assembly;

perform one or more diagnostic self-tests on the electronic module assembly to determine the ability of the power source to deploy one or more of the personal restraint systems;

provide results of the one or more diagnostic self-tests performed; and return to the sleep mode after providing the results.

* * * * *